United States Patent
Chan et al.

(10) Patent No.: US 9,711,416 B2
(45) Date of Patent: Jul. 18, 2017

(54) FIN FIELD EFFECT TRANSISTOR INCLUDING A STRAINED EPITAXIAL SEMICONDUCTOR SHELL

(71) Applicant: International Business Machines Corporation, Armonk, NY (US)

(72) Inventors: Kevin K. Chan, Staten Island, NY (US); Young-Hee Kim, Mohegan Lake, NY (US); Masaharu Kobayashi, Yorktown Heights, NY (US); Jinghong Li, Poughquag, NY (US); Dae-Gyu Park, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/207,012

(22) Filed: Jul. 11, 2016

(65) Prior Publication Data
US 2016/0322500 A1    Nov. 3, 2016

Related U.S. Application Data

(62) Division of application No. 14/162,933, filed on Jan. 24, 2014, now Pat. No. 9,391,171.

(51) Int. Cl.
*H01L 29/66* (2006.01)
*H01L 21/84* (2006.01)
(Continued)

(52) U.S. Cl.
CPC ...... *H01L 21/845* (2013.01); *H01L 21/02524* (2013.01); *H01L 21/02529* (2013.01);
(Continued)

(58) Field of Classification Search
CPC .................................................. H01L 29/7849
(Continued)

(56) References Cited

U.S. PATENT DOCUMENTS

| 6,413,802 | B1 | 7/2002 | Hu et al. |
| 6,800,910 | B2 | 10/2004 | Lin et al. |

(Continued)

OTHER PUBLICATIONS

Hashemi, P. et al., "High-performance Si1—xGex channel on insulator trigate PFETs featuring an implant-free process and aggressively-scaled fin and gate dimensions" 2013 Symposium on VLSI Circuits (VLSIC) (Jun. 12-14, 2013) pp. T18-T19.

(Continued)

*Primary Examiner* — Ajay K Arora
(74) *Attorney, Agent, or Firm* — Scully, Scott, Murphy & Presser, P.C.; Steven J. Meyers

(57) ABSTRACT

A semiconductor fin including a single crystalline semiconductor material is formed on a dielectric layer. A semiconductor shell including an epitaxial semiconductor material is formed on all physically exposed surfaces of the semiconductor fin by selective epitaxy, which deposits the semiconductor material only on semiconductor surfaces and not on dielectric surfaces. The epitaxial semiconductor material can be different from the single crystalline semiconductor material, and the semiconductor shell can be bilaterally strained due to lattice mismatch. A fin field effect transistor including a strained channel can be formed. Further, the semiconductor shell can advantageously alter properties of the source and drain regions, for example, by allowing incorporation of more dopants or by facilitating a metallization process.

19 Claims, 14 Drawing Sheets

(51) Int. Cl.
| | |
|---|---|
| *H01L 29/78* | (2006.01) |
| *H01L 29/10* | (2006.01) |
| *H01L 27/12* | (2006.01) |
| *H01L 21/02* | (2006.01) |
| *H01L 21/16* | (2006.01) |
| *H01L 21/265* | (2006.01) |
| *H01L 29/06* | (2006.01) |

(52) U.S. Cl.
CPC .. *H01L 21/02532* (2013.01); *H01L 21/02598* (2013.01); *H01L 21/02636* (2013.01); *H01L 21/165* (2013.01); *H01L 21/26513* (2013.01); *H01L 27/1211* (2013.01); *H01L 29/0649* (2013.01); *H01L 29/1054* (2013.01); *H01L 29/66795* (2013.01); *H01L 29/785* (2013.01); *H01L 29/7849* (2013.01)

(58) Field of Classification Search
USPC .......................................... 438/283; 257/330
See application file for complete search history.

(56) References Cited

U.S. PATENT DOCUMENTS

| | | |
|---|---|---|
| 7,271,456 B2 | 9/2007 | Oh et al. |
| 7,314,802 B2 | 1/2008 | Zhu et al. |
| 7,393,733 B2 | 7/2008 | Currie |
| 7,488,650 B2 | 2/2009 | Schulz |
| 7,671,418 B2 | 3/2010 | Topaloglu |
| 7,759,737 B2 | 7/2010 | Cho et al. |
| 7,821,061 B2 | 10/2010 | Jin et al. |
| 7,964,465 B2 | 6/2011 | Anderson et al. |
| 8,237,226 B2 | 8/2012 | Okano |
| 2010/0038679 A1* | 2/2010 | Chan ................ H01L 29/66795 257/190 |
| 2011/0291188 A1 | 12/2011 | Cheng et al. |
| 2013/0023092 A1 | 1/2013 | Oda et al. |
| 2013/0105897 A1 | 5/2013 | Bangsaruntip et al. |

OTHER PUBLICATIONS

Irisawa, I. et al., "High Performance Multi-Gate pMOSFETs Using Uniaxially-Strained SGOI Channels" IEEE International Electron Devices Meeting: IEDM Technical Digest (Dec. 5, 2005) pp. 709-712.

Ok, I. et al., "Strained SiGe and Si FinFETs for High Performance Logic with SiGe/Si stack on SOI" International Electron Devices Meeting: IEDM Technical Digest (Dec. 6-8, 2010) pp. 34.2.1-34.2.4.

Ikeda, K. et al., "High-mobility and Low-parasitic Resistance Characteristics in Strained Ge Nanowire pMOSFETs with Metal Source/Drain Structure Formed by Doping-free Processes" 2012 Symposium on VLSI Technology Digest of Technical Papers (Jun. 12-14, 2012) pp. 165-166.

Adhikari, H. et al., "High Mobility SiGe Shell-Si Core Omega Gate pFETs" International Symposium on VLSI Technology, Systems, and Applications(Apr. 27-29, 2009) pp. 136-138.

* cited by examiner

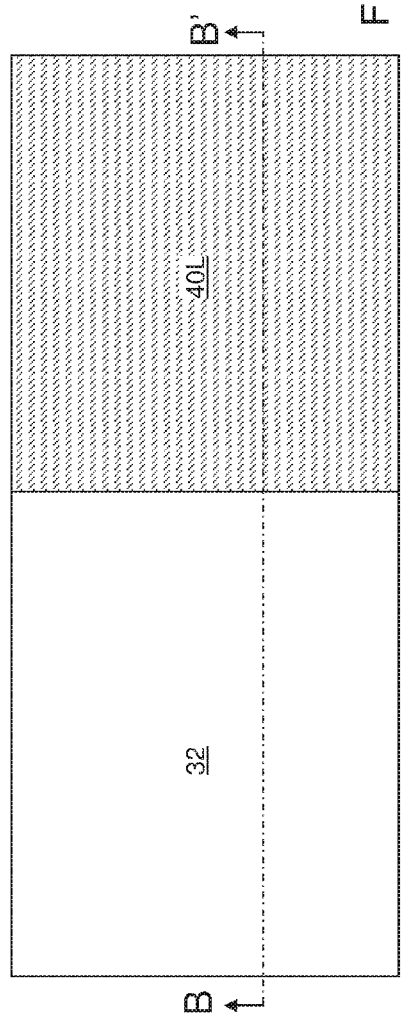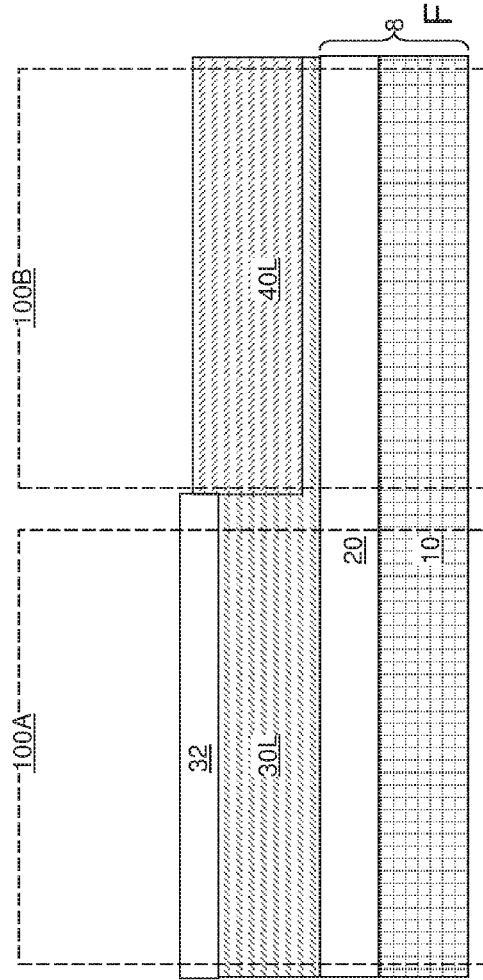

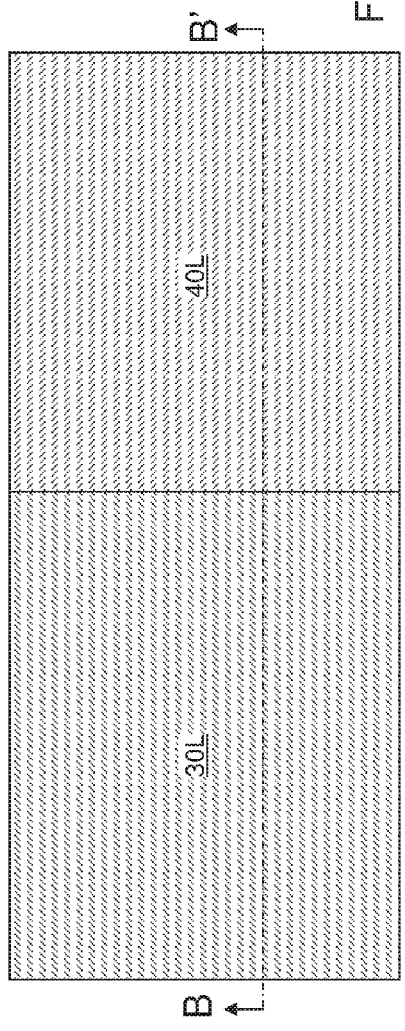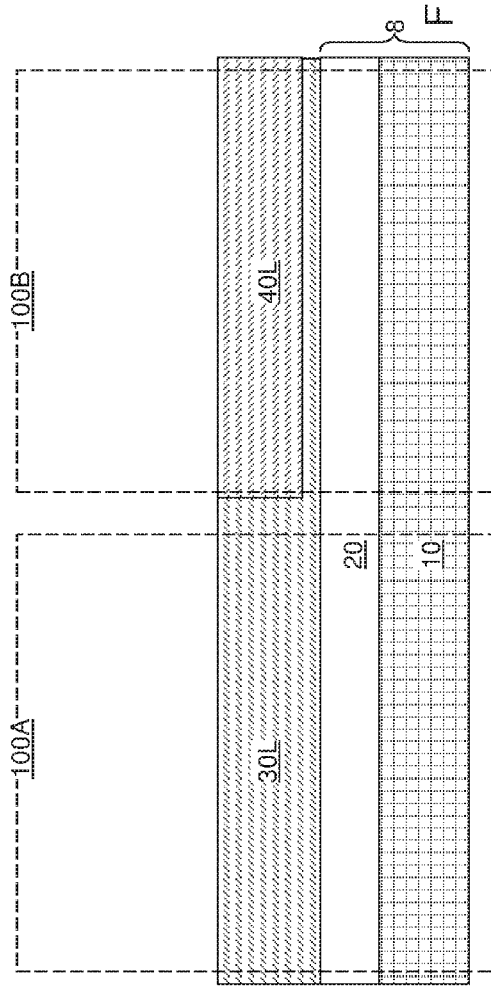
FIG. 3A
FIG. 3B

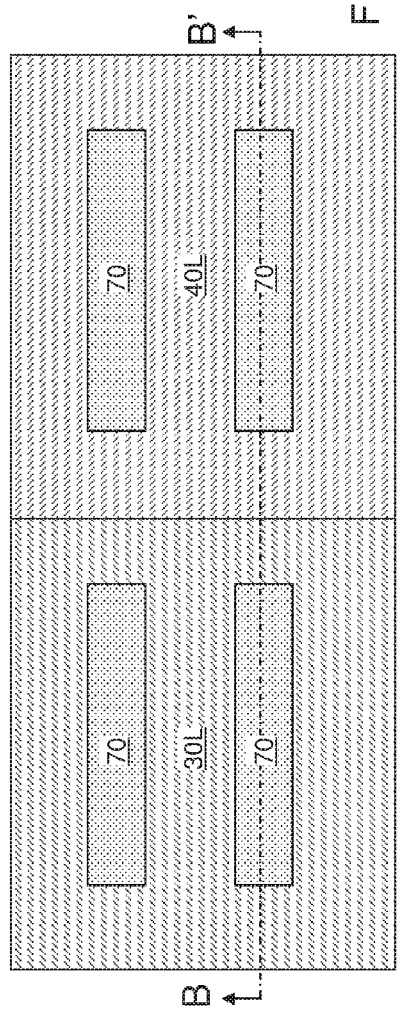
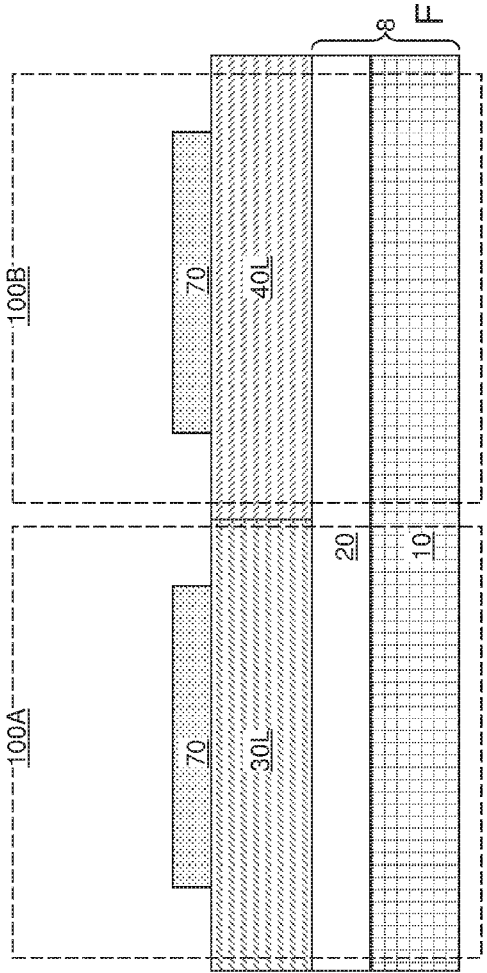

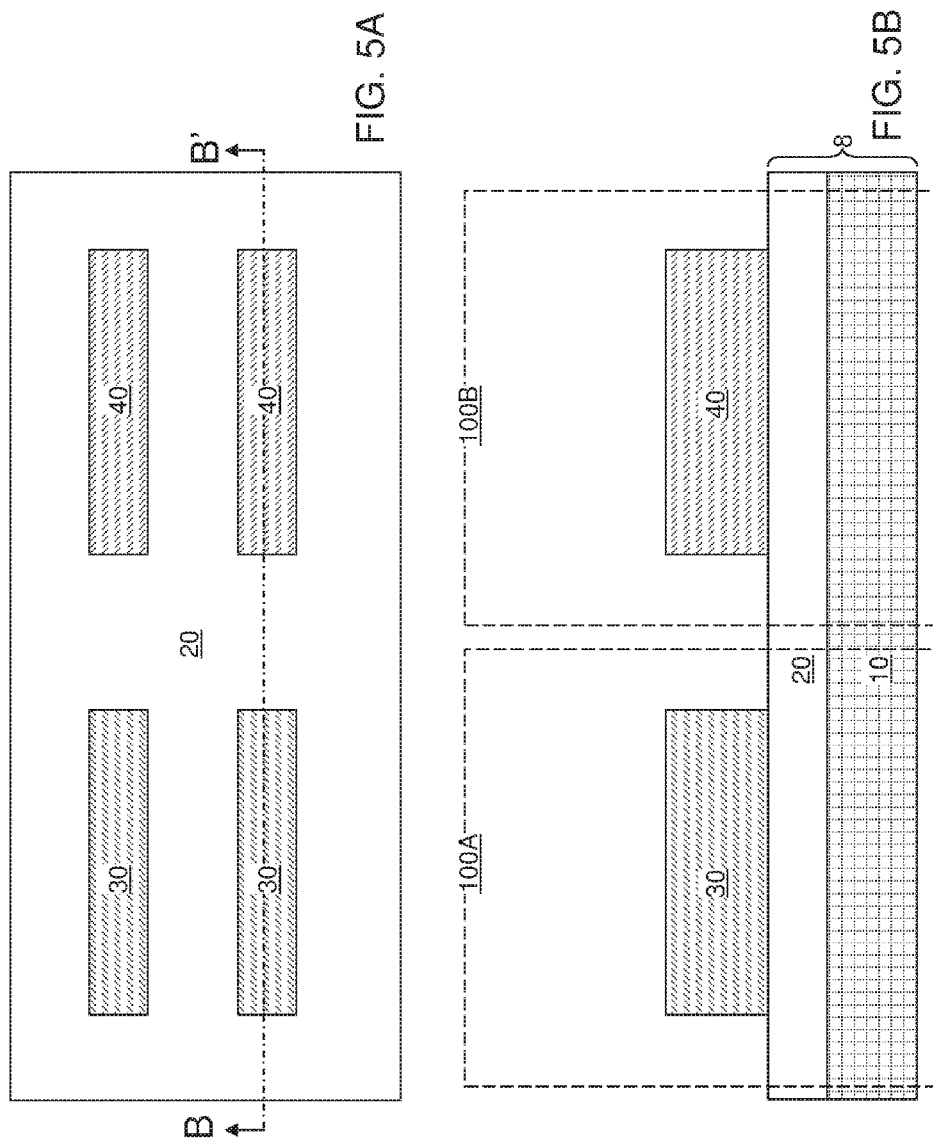

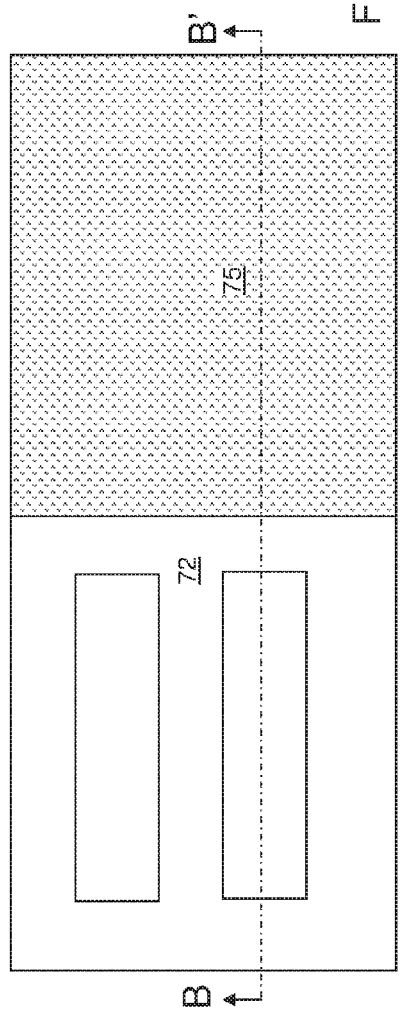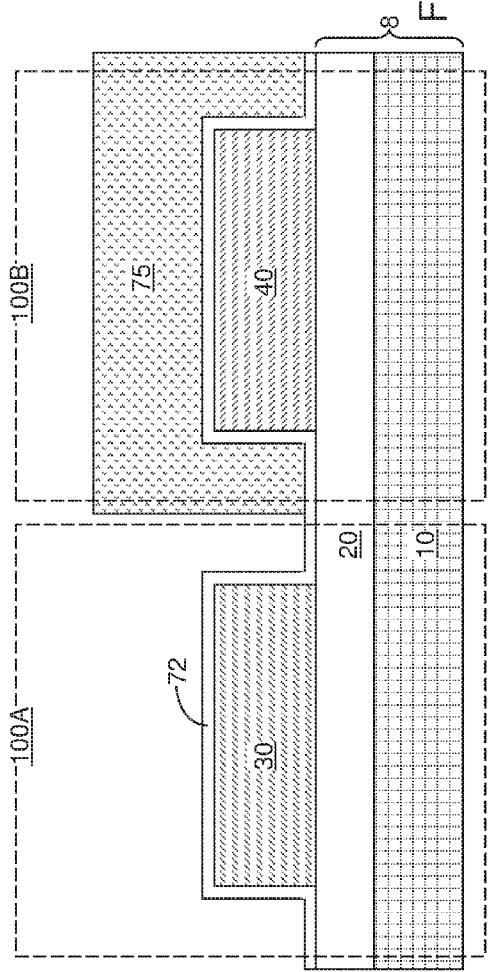

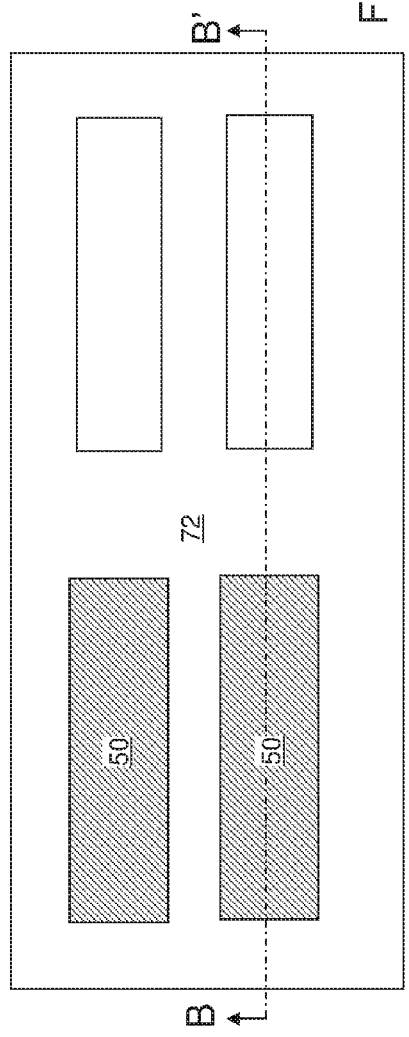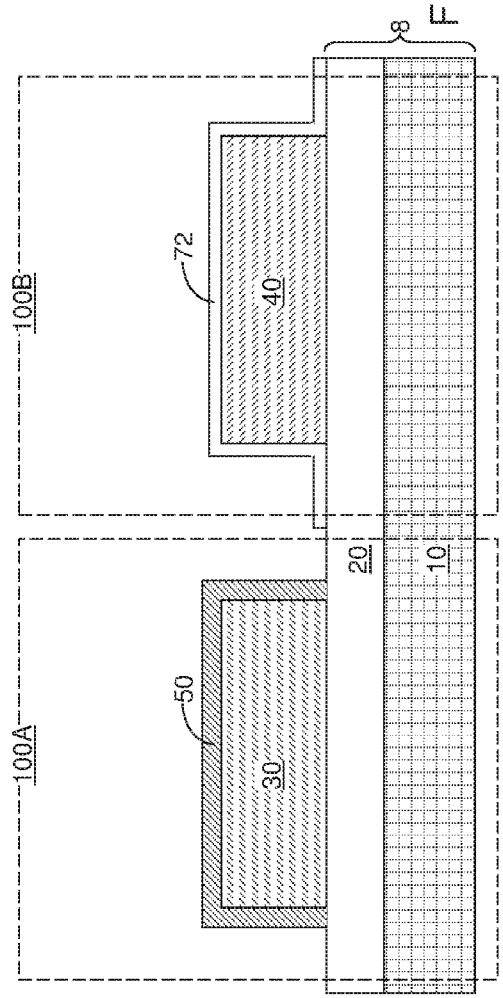

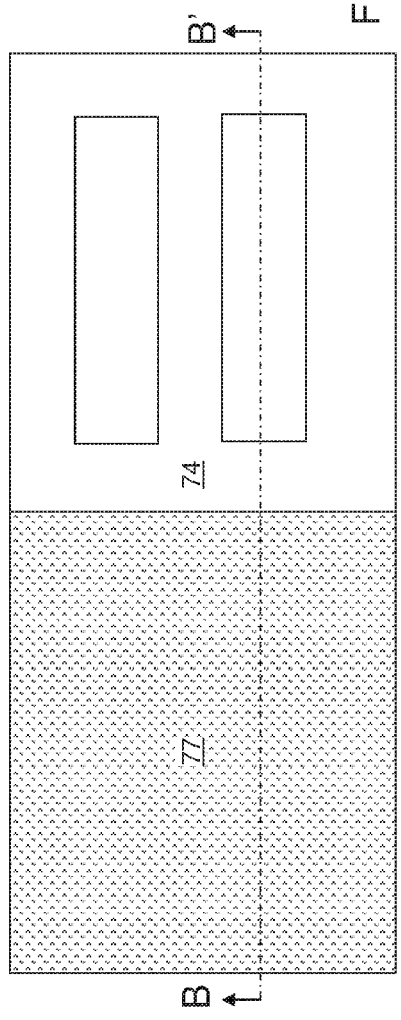
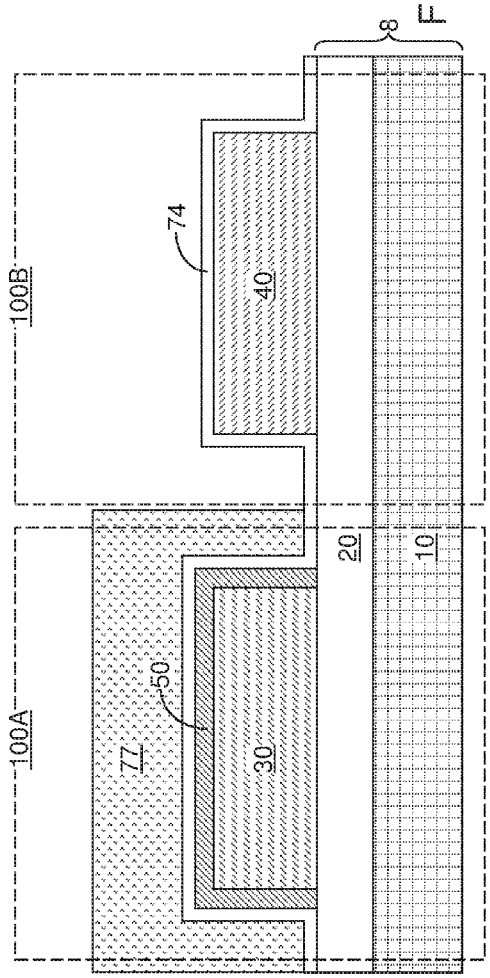
FIG. 8A
FIG. 8B

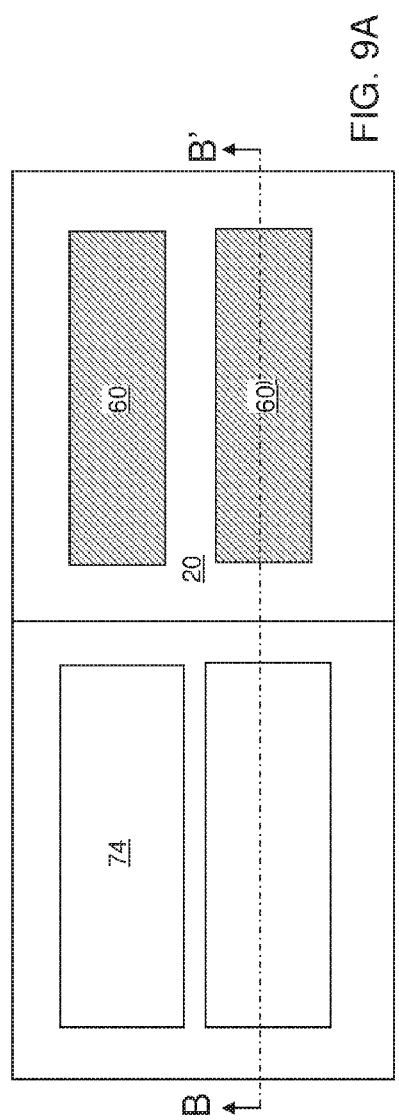
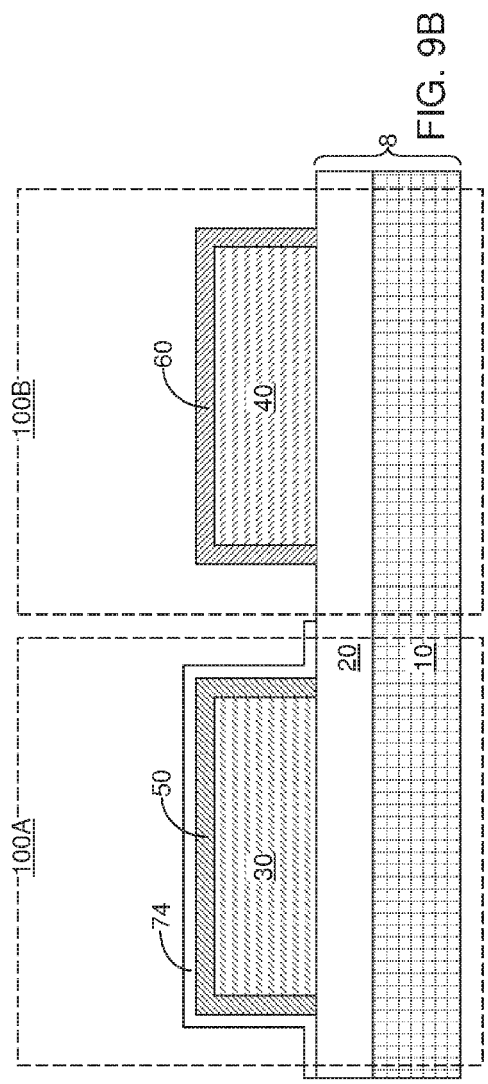

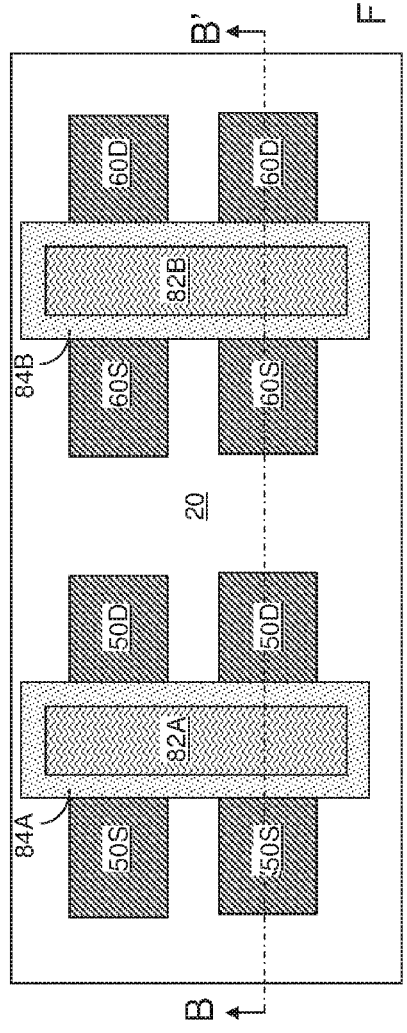
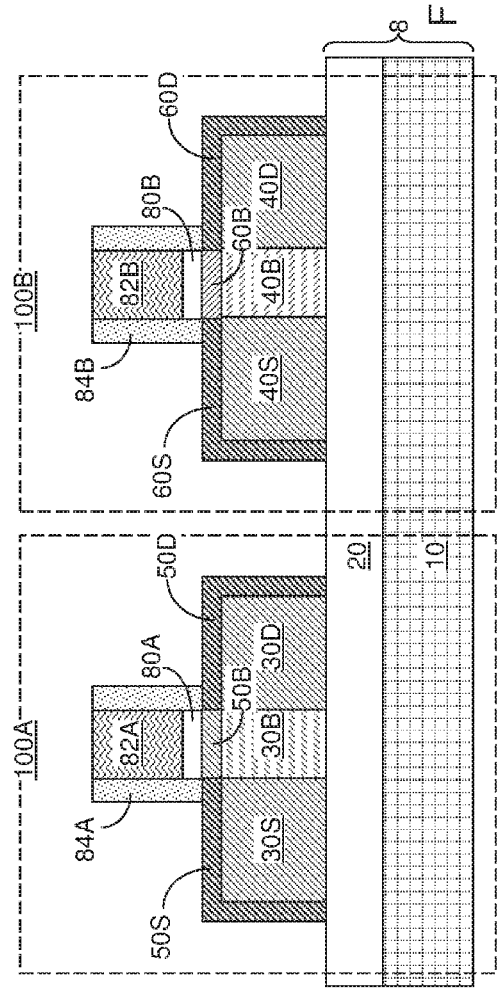
FIG. 11A
FIG. 11B

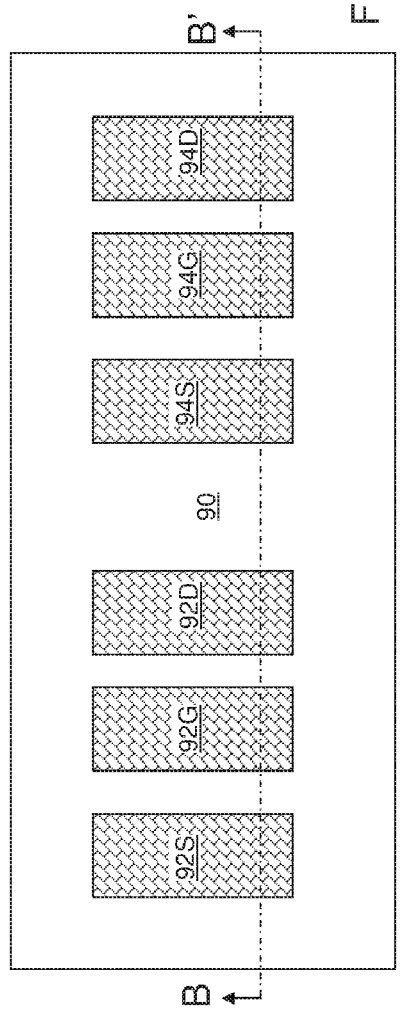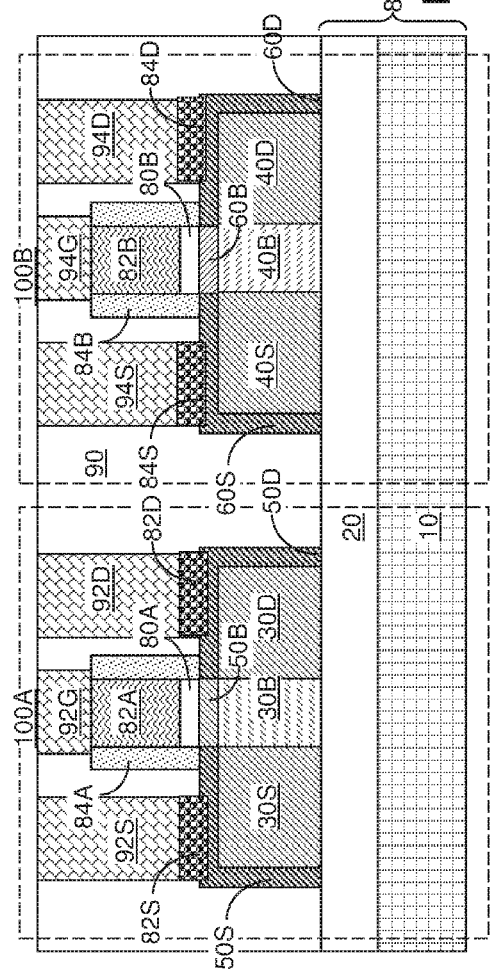

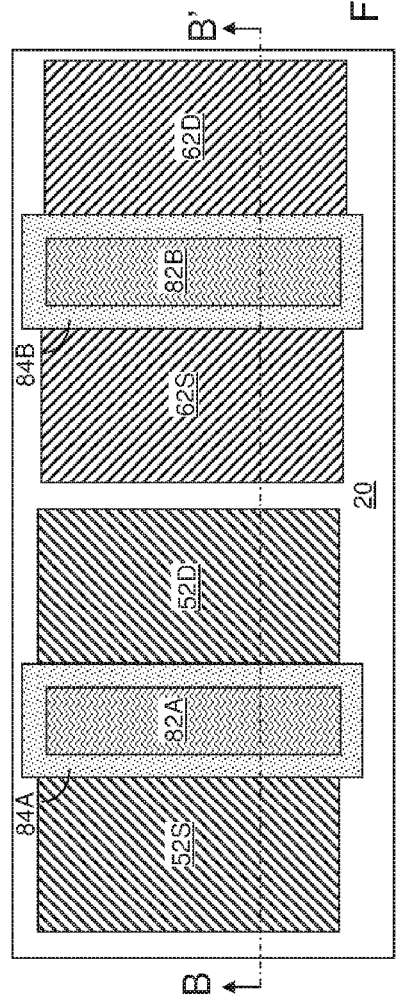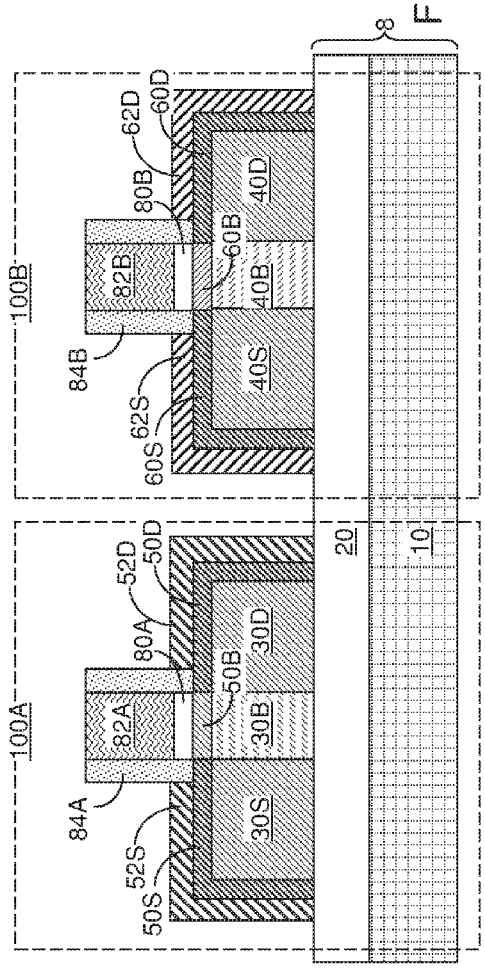

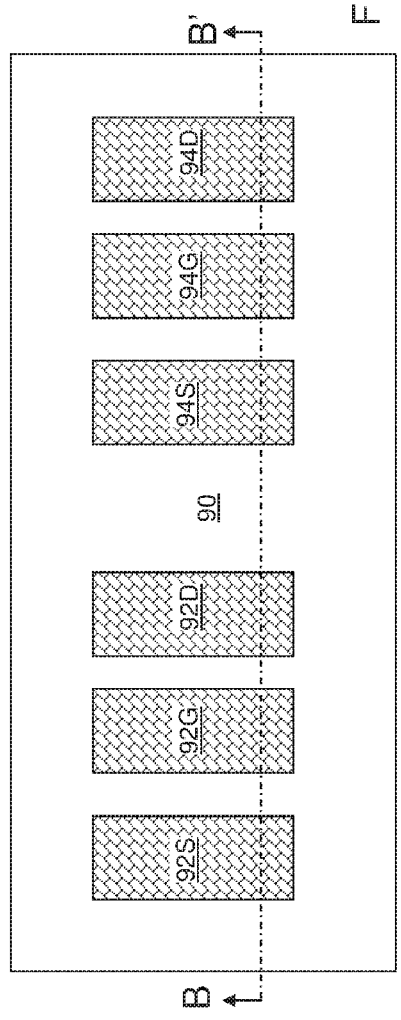
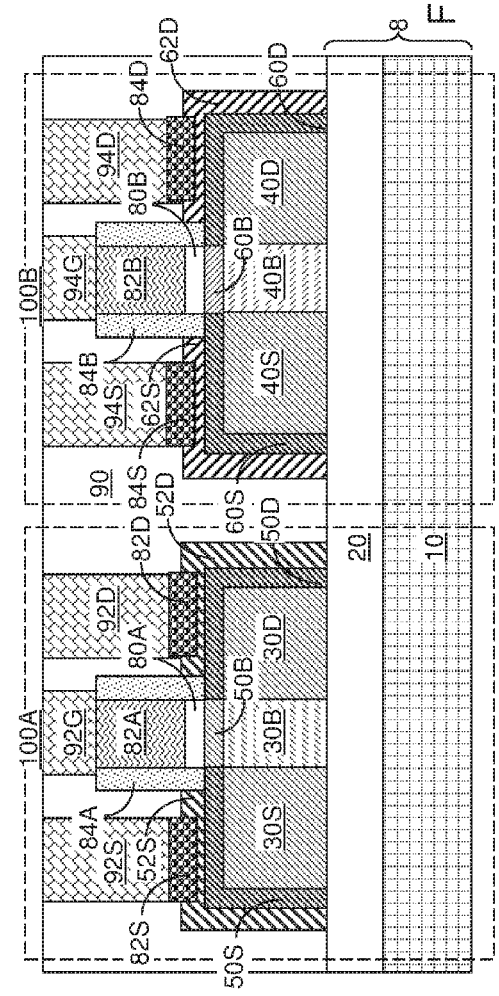
FIG. 14A
FIG. 14B

FIN FIELD EFFECT TRANSISTOR INCLUDING A STRAINED EPITAXIAL SEMICONDUCTOR SHELL

BACKGROUND

The present disclosure generally relates to semiconductor devices, and particularly to field effect transistors having a strained epitaxial semiconductor shell, and methods of manufacturing the same.

Fin field effect transistors are employed in advanced semiconductor chips to provide higher on current per unit area as well as tight channel control. Increase in the on-current per unit area can thus be achieved in conjunction with reduction in the leakage current in the off-state with fin field effect transistors. A semiconductor fin generally includes a same semiconductor material throughout. Thus, the material properties of the channel of each fin field effect transistor are determined by the material of the semiconductor fin of the fin field effect transistor.

SUMMARY

A semiconductor fin including a single crystalline semiconductor material is formed on a dielectric layer. A semiconductor shell including an epitaxial semiconductor material is formed on all physically exposed surfaces of the semiconductor fin by selective epitaxy, which deposits the semiconductor material only on semiconductor surfaces and not on dielectric surfaces. The epitaxial semiconductor material can be different from the single crystalline semiconductor material, and the semiconductor shell can be bilaterally strained due to lattice mismatch. A fin field effect transistor including a strained channel can be formed. Further, the semiconductor shell can advantageously alter properties of the source and drain regions, for example, by allowing incorporation of more dopants or by facilitating a metallization process.

According to an aspect of the present disclosure, a method of forming a semiconductor structure is provided. A semiconductor fin including a first semiconductor material is formed on an insulator layer. The semiconductor fin laterally is bounded by a pair of parallel lengthwise sidewalls and a pair of parallel widthwise sidewalls. An epitaxial semiconductor shell including a second semiconductor material is formed with epitaxially alignment with the first semiconductor material on all surfaces of the pair of parallel lengthwise sidewalls and the pair of parallel widthwise sidewalls.

According to another aspect of the present disclosure, a semiconductor structure includes an insulator layer located in a substrate, and a semiconductor fin including a first semiconductor material. The semiconductor fin is laterally bounded by a pair of parallel lengthwise sidewalls and a pair of parallel widthwise sidewalls, and is located on the insulator layer. The semiconductor structure further includes an epitaxial semiconductor shell that contains a second semiconductor material that is epitaxially aligned to the first semiconductor material. The epitaxial semiconductor shell contiguously contacts all of the pair of parallel lengthwise sidewalls and all of the pair of parallel widthwise sidewalls.

BRIEF DESCRIPTION OF SEVERAL VIEWS OF THE DRAWINGS

FIG. 2A is a top-down view of the exemplary semiconductor structure after formation of an epitaxial semiconductor material layer having a different composition than the top semiconductor layer according to an embodiment of the present disclosure.

FIG. 2B is a vertical cross-sectional view of the exemplary semiconductor structure of FIG. 2A along the vertical plane B-B' of FIG. 2A.

FIG. 3A is a top-down view of the exemplary semiconductor structure after planarizing top surfaces of the top semiconductor layer and the epitaxial semiconductor material layer according to an embodiment of the present disclosure.

FIG. 3B is a vertical cross-sectional view of the exemplary semiconductor structure of FIG. 3A along the vertical plane B-B' of FIG. 3A.

FIG. 4A is a top-down view of the exemplary semiconductor structure after forming fin mask structures according to an embodiment of the present disclosure.

FIG. 4B is a vertical cross-sectional view of the exemplary semiconductor structure of FIG. 4A along the vertical plane B-B' of FIG. 4A.

FIG. 5A is a top-down view of the exemplary semiconductor structure after formation of semiconductor fins according to an embodiment of the present disclosure.

FIG. 5B is a vertical cross-sectional view of the exemplary semiconductor structure of FIG. 5A along the vertical plane B-B' of FIG. 5A.

FIG. 6A is a top-down view of the exemplary semiconductor structure after formation of a first dielectric mask layer and a first patterned photoresist layer according to an embodiment of the present disclosure.

FIG. 6B is a vertical cross-sectional view of the exemplary semiconductor structure of FIG. 6A along the vertical plane B-B' of FIG. 6A.

FIG. 7A is a top-down view of the exemplary semiconductor structure after patterning the first dielectric mask layer and performing a first selective epitaxy process according to an embodiment of the present disclosure.

FIG. 7B is a vertical cross-sectional view of the exemplary semiconductor structure of FIG. 7A along the vertical plane B-B' of FIG. 7A.

FIG. 8A is a top-down view of the exemplary semiconductor structure after removal of the first dielectric mask layer and formation of a second dielectric mask layer and a second patterned photoresist layer according to an embodiment of the present disclosure.

FIG. 8B is a vertical cross-sectional view of the exemplary semiconductor structure of FIG. 8A along the vertical plane B-B' of FIG. 8A.

FIG. 9A is a top-down view of the exemplary semiconductor structure patterning the second dielectric mask layer and performing a second selective epitaxy process according to an embodiment of the present disclosure.

FIG. 9B is a vertical cross-sectional view of the exemplary semiconductor structure of FIG. 9A along the vertical plane B-B' of FIG. 9A.

FIG. 11A is a top-down view of the exemplary semiconductor structure after formation of source and drain regions and gate electrodes according to an embodiment of the present disclosure.

FIG. 11B is a vertical cross-sectional view of the exemplary semiconductor structure of FIG. 11A along the vertical plane B-B' of FIG. 11A.

FIG. 12A is a top-down view of the exemplary semiconductor structure after formation of a contact level dielectric layer and various contact via structures according to an embodiment of the present disclosure.

FIG. 12B is a vertical cross-sectional view of the exemplary semiconductor structure of FIG. 12A along the vertical plane B-B' of FIG. 12A.

FIG. 13A is a top-down view of a variation of the exemplary semiconductor structure after formation of raised source and drain regions according to an embodiment of the present disclosure.

FIG. 13B is a vertical cross-sectional view of the variation of the exemplary semiconductor structure of FIG. 13A along the vertical plane B-B' of FIG. 13A.

FIG. 14A is a top-down view of the variation of the exemplary semiconductor structure after formation of a contact level dielectric layer and various contact via structures according to an embodiment of the present disclosure.

FIG. 14B is a vertical cross-sectional view of the variation of the exemplary semiconductor structure of FIG. 14A along the vertical plane B-B' of FIG. 14A.

DETAILED DESCRIPTION

Figure 1A:
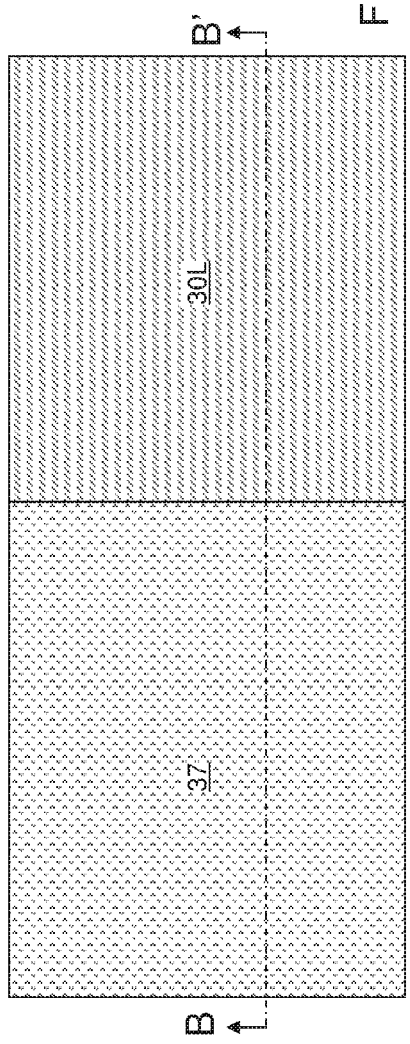
FIG. 1A is a top-down view of an exemplary semiconductor structure after recessing a portion of a top semiconductor layer according to an embodiment of the present disclosure.

As stated above, the present disclosure relates to field effect transistors having a strained epitaxial semiconductor shell, and methods of manufacturing the same. Aspects of the present disclosure are now described in detail with accompanying figures. Like and corresponding elements are referred to by like reference numerals. Proportions of various elements in the accompanying figures are not drawn to scale. As used herein, ordinals such as "first" and "second" are employed merely to distinguish similar elements, and different ordinals may be employed to designate a same element in the specification and/or claims.

Figure 1B:
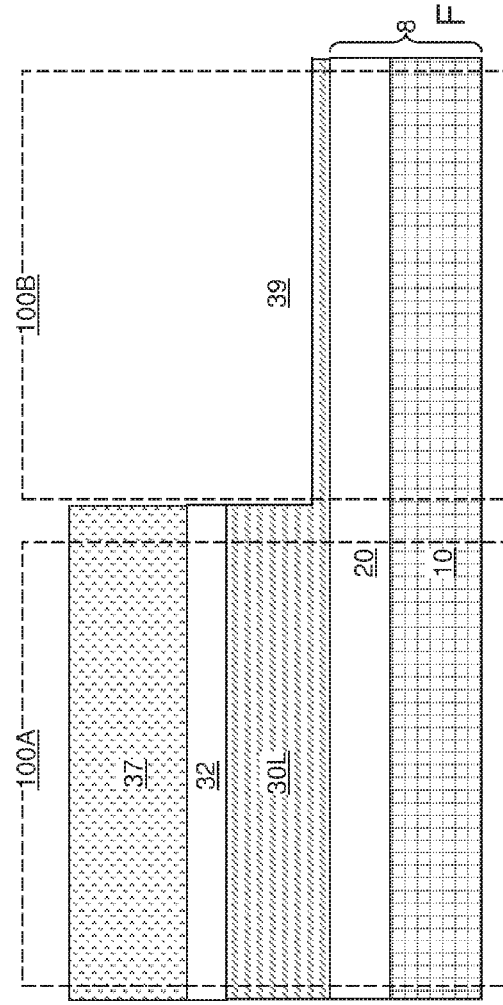
FIG. 1B is a vertical cross-sectional view of the exemplary semiconductor structure of FIG. 1A along the vertical plane B-B' of FIG. 1A.

Referring to FIGS. 1A and 1B, an exemplary semiconductor structure of the present disclosure includes a semiconductor substrate that contains a semiconductor material layer 30L. The semiconductor material layer 30L can be a top semiconductor layer located within a semiconductor-on-insulator (SOI) substrate, or can be an upper portion of a bulk semiconductor substrate. The semiconductor material layer 30L can be located on a substrate 8, which can be a stack of a buried insulator layer 20 and a handle substrate 10, or can be a lower portion of a bulk substrate. The semiconductor material layer 30L includes a semiconductor material, which is herein referred to as a first semiconductor material. As provided, the semiconductor material layer 30L may have a uniform thickness throughout. The thickness of the semiconductor material layer 30L can be in a range from 5 nm to 500 nm, although lesser and greater thicknesses can also be employed.

In one embodiment, the first semiconductor material can be a single crystalline semiconductor material. The first semiconductor material can be an elemental semiconductor material, an alloy of at least two elemental semiconductor materials, a III-V compound semiconductor material, a II-VI compound semiconductor material, or an organic semiconductor material. In one embodiment, the first semiconductor material can be selected from single crystalline silicon, a single crystalline silicon-germanium alloy, a single crystalline silicon-carbon alloy, and a single crystalline silicon-germanium-carbon alloy. In one embodiment, the first semiconductor material can be single crystalline silicon.

A dielectric mask layer 32 is formed over the top surface of the semiconductor material layer 30L. The dielectric mask layer 32 includes a dielectric material such as silicon oxide, silicon nitride, silicon oxynitride, a dielectric metal oxide, or a combination thereof. A photoresist layer 37 is applied over the dielectric mask layer 32, and is lithographically patterned to cover the dielectric material layer 32 within a first device region 100A, while the photoresist layer 37 is removed from a second device region 100B.

The dielectric mask layer 32 is etched employing the photoresist layer 37 as an etch mask. An anisotropic etch or an isotropic etch may be employed to etch physically exposed portions of the dielectric mask layer 32. Subsequently, an upper portion of the semiconductor material layer 30L within the area that is not covered by the photoresist layer 37 is etched employing the photoresist layer 37 and/or the dielectric mask layer 32 as an etch mask. A recessed region 39 is formed within the second device region 100B.

If the semiconductor material layer 30L is provided over a buried insulator layer 20, the depth of recess in the recessed region 39 is selected to be less than the thickness of the semiconductor material layer 30L is less than the thickness of the semiconductor material layer 30L. In general, the recess depth is controlled such that the bottom surface of the recessed region 39 is a planar surface of the first semiconductor material within the semiconductor material layer 30L, which can be a top semiconductor layer of an SOI substrate or an upper portion of a bulk semiconductor substrate. The photoresist layer 37 is subsequently removed, for example, by ashing.

Referring to FIGS. 2A and 2B, an epitaxial semiconductor material layer 40L is deposited on the physically exposed bottom surface and sidewalls of the recessed region 39 (See FIG. 1B) by selective epitaxy. The epitaxial semiconductor material layer 40L includes a single crystalline semiconductor material having a different composition than first semiconductor material.

In one embodiment, the semiconductor material of the epitaxial semiconductor material layer 40L is lattice mismatched with respect to the first semiconductor material. In one embodiment, the first semiconductor material and the semiconductor material of the epitaxial semiconductor material layer 40L can be two semiconductor materials having different semiconductor compositions and selected from single crystalline silicon, single crystalline silicon-germanium alloys, single crystalline silicon-carbon alloys, and a single crystalline silicon-germanium-carbon alloy. As used herein, the "semiconductor composition" of semiconductor material refers to the component of the composition of the semiconductor material that excludes electrical dopants, which can be p-type dopants such as B, Ga, or As and/or n-type dopants such as P, As, or Sb. In other words, the semiconductor composition of a semiconductor material is a composition of an intrinsic semiconductor material obtained from the semiconductor material by removal of all electrical dopants. In one embodiment, the first semiconductor material is single crystalline silicon, and the semiconductor material of the epitaxial semiconductor material layer 40L can be a single crystalline silicon-germanium alloy. A top surface of the epitaxial semiconductor material layer 40L may contact a sidewall of the dielectric mask layer 32, or a portion of the epitaxial semiconductor material layer 40L may overlie a peripheral the epitaxial semiconductor material layer 40L.

Referring to FIGS. 3A and 3B, the dielectric mask layer 32 is removed selective to the semiconductor materials of the semiconductor material layer 30L and the epitaxial semiconductor material layer 40L. If the dielectric mask layer 32 includes silicon oxide, a wet etch employing hydrofluoric acid can be employed to remove the dielectric mask layer 32 selective to the semiconductor materials of the semiconductor material layer 30L and the epitaxial semiconductor material layer 40L. If the dielectric mask layer 32 includes silicon nitride, a wet etch employing hot phosphoric acid can be employed to remove the dielectric mask layer 32 selective to the semiconductor materials of the semiconductor material layer 30L and the epitaxial semiconductor material layer 40L.

Optionally, a planarization process can be employed to planarize the top surfaces of the semiconductor material layer 30L and the epitaxial semiconductor material layer 40L. In other words, the top surface of one of the semiconductor material layer 30L and the epitaxial semiconductor material layer 40L that protrudes above the top surface of the other of the semiconductor material layer 30L and the epitaxial semiconductor material layer 40L can be recessed during the planarization process so that the top surfaces of the semiconductor material layer 30L and the epitaxial semiconductor material layer 40L become coplanar with each other.

Optionally, a thermal anneal can be performed to diffuse the semiconductor materials of the semiconductor material layer 30L and the epitaxial semiconductor material layer 40L across the interface between the semiconductor material layer 30L and the epitaxial semiconductor material layer 40L. In this case, the composition of the semiconductor materials in the second device region 100B can be homogenized, and the volume of the epitaxial semiconductor material layer 40L may expand vertically and laterally so that the epitaxial semiconductor material layer 40L contacts the top surface of the buried insulator layer 20. The epitaxial semiconductor material layer 40L can have a portion having a homogeneous composition within the second device region 100B.

Referring to FIGS. 4A and 4B, fin mask structures 70 are formed on the top surfaces of the semiconductor material layer 30L and the epitaxial semiconductor material layer 40L. In one embodiment, the fin mask structures 70 can be patterned portions of a dielectric material layer. The fin mask structures 70 can be formed, for example, by deposition and patterning of a dielectric material layer. The dielectric material layer includes a dielectric material such as silicon oxide, silicon nitride, a dielectric metal oxide, or a combination thereof. The dielectric material layer can be deposited by chemical vapor deposition (CVD) or atomic layer deposition (ALD). The patterning of the dielectric material layer can be performed, for example, by application and lithographic patterning of a photoresist layer, and transfer of the patterns in the photoresist layer into the dielectric material layer by an etch, which can be an anisotropic etch such as a reactive ion etch. Remaining portions of the photoresist layer can be removed, for example, by ashing. The thickness of the fin mask structures 70 can be in a range from 1 nm to 50 nm, although lesser and greater thicknesses can also be employed.

In another embodiment, the fin mask structures 70 can be a patterned photoresist layer. In this case, a photoresist layer can be applied over the semiconductor material layer 30L and the epitaxial semiconductor material layer 40L, and can be lithographically patterned to form the fin mask structures.

In one embodiment, at least one of the fin mask structures 70 can have a rectangular horizontal cross-sectional shape, i.e., a horizontal cross-sectional shape of a rectangle. In one embodiment, a plurality of fin mask structures 70 having rectangular horizontal cross-sectional shapes can be formed.

Referring to FIGS. 5A and 5B, the patterns in the fin mask structures 70 can be transferred into the semiconductor material layer 30L and the epitaxial semiconductor material layer 40L by an anisotropic etch that employs the fin mask structures 70 as an etch mask. Each patterned portion of the semiconductor material layer 30L constitutes a semiconductor fin, which is herein referred to as a first semiconductor fin 30. Each patterned portion of the epitaxial semiconductor material layer 40L constitutes a semiconductor fin, which is herein referred to as a second semiconductor fin 40.

As used herein, a "semiconductor fin" refers to a semiconductor material portion having a pair of parallel lengthwise sidewalls that are laterally spaced by a uniform dimension. In one embodiment, each semiconductor fin (30, 40) can have a rectangular horizontal cross-sectional shape such that the spacing between the pair of parallel lengthwise sidewalls is the same as the length of shorter sides of the shape of the rectangular horizontal cross-sectional shape. As used herein, a "fin field effect transistor" refers to a field effect transistor in which at least a body region is located within a semiconductor fin.

In one embodiment, each of the semiconductor fins can have a rectangular horizontal cross-sectional shape bounded by a pair of parallel lengthwise sidewalls and a pair of parallel widthwise sidewalls. As used herein, a "lengthwise direction" of an element refers to a direction about which the moment of inertia of the element becomes a minimum. As used herein, a lengthwise sidewall of an element refers to a sidewall of an element that extends along the lengthwise direction of the element. As used herein, a widthwise sidewall of an element refers to a sidewall of the element that extends along a horizontal direction that is perpendicular to the lengthwise direction of the element.

In one embodiment, the fin mask structures 70 can have rectangular horizontal cross-sectional shapes. Each first semiconductor fin 30 can be laterally bounded by a pair of parallel lengthwise sidewalls and a pair of parallel widthwise sidewalls. Each second semiconductor fin 40 can be laterally bounded by a pair of parallel lengthwise sidewalls and a pair of parallel widthwise sidewalls. Each semiconductor fin 30 can have a planar top surface having a periphery that coincides with top edges of the pair of parallel lengthwise sidewalls and the pair of parallel widthwise sidewalls of the semiconductor fin 30. In one embodiment, the top surfaces of the semiconductor fins (30, 40) can be coplanar, i.e., be located within a same horizontal plane.

If the semiconductor fins (30, 40) are formed by patterning an upper portion of a bulk semiconductor substrate, a shallow trench isolation layer including a dielectric material can be formed around a lower portion of each semiconductor fin (30, 40). The shallow trench isolation layer can be formed by deposition of a dielectric material layer, planarization of the dielectric material layer, and recessing of the dielectric material layer relative to the top surfaces of the semiconductor fins (30, 40). Alternately, the shallow trench isolation layer can be formed by spin-on coating of a flowable dielectric material such as spin-on oxide (SOG).

Referring to FIGS. 6A and 6B, a first dielectric mask layer 72 is formed on the top surfaces and the sidewalls of the semiconductor fins (30, 40) and the top surface of the buried insulator layer 20 (or a portion of a bulk semiconductor substrate underlying the semiconductor fins). The first dielectric mask layer 72 includes a dielectric material such as silicon oxide, silicon nitride, silicon oxynitride, dielectric metal oxide, or a combination thereof. The first dielectric mask layer 72 is formed by a conformal deposition method such as chemical vapor deposition (CVD) or atomic layer deposition (ALD). The thickness of the first dielectric mask layer 72 can be in a range from 1 nm to 30 nm, although lesser and greater thicknesses can also be employed.

A first patterned photoresist layer 75 covering the second semiconductor fins 40 in the second device region 100B can be formed, for example, by application of a blanket (unpatterned) photoresist layer over the entire area of the exemplary semiconductor structure, and subsequently removing portions of the applied photoresist layer from the first device region 100A, while the portion of the photoresist layer within the second device region 100B remains over the second semiconductor fins 40. Thus, the first patterned photoresist layer 75 can be present in the second device region 100B, and not present in the first device region 100A.

Referring to FIGS. 7A and 7B, the unmasked portion of the first dielectric mask layer 72 in the first device region 100A is removed by an etch, which can be an isotropic etch such as a wet etch. The first patterned photoresist layer 75 is subsequently removed, for example, by ashing.

A selective epitaxy process is performed to deposit a single crystalline semiconductor material on the physically exposed surfaces of the first semiconductor fins 30. The single crystalline semiconductor material deposited by the selective epitaxy process is herein referred to as a second semiconductor material. The second semiconductor material is a semiconductor material that is different from the first semiconductor material in composition, and can be single crystalline silicon, a single crystalline silicon germanium alloy, a singe crystalline silicon carbon alloy, a single crystalline silicon germanium carbon alloy, or a single crystalline compound semiconductor material.

In one embodiment, the first semiconductor material can be single crystalline silicon, and the second semiconductor material can be a single crystalline silicon germanium alloy, a single crystalline silicon carbon alloy, or a single crystalline silicon germanium carbon alloy. In one embodiment, the second semiconductor material has a different band gap width than the first semiconductor material. In one embodiment, the first semiconductor material can be single crystalline silicon, and the second semiconductor material can be a single crystalline silicon germanium alloy.

Because the second semiconductor material is different from the first semiconductor material, the selective epitaxy process is a selective heteroepitaxy process, i.e., a selective epitaxy process that deposits a material different from the underlying material to a surface of the underlying material. During the selective epitaxy process, at least one semiconductor precursor gas and an etchant gas are flowed simultaneously or alternately into a processing chamber including the exemplary semiconductor structure. The second semiconductor material is deposited only on single crystalline surfaces such as the physically exposed surfaces of the first semiconductor fins 30, and is not deposited on amorphous surfaces such as the surfaces of the first dielectric mask layer 72 and the buried insulator layer 20.

Each contiguous portion of the second semiconductor material deposited directly on the surfaces of a first semiconductor fin 30 constitutes a contiguous semiconductor material layer that contacts all surfaces of a pair of parallel lengthwise sidewalls, a pair of parallel widthwise sidewalls, and a planar top surface of the first semiconductor fin 30, and is herein referred to as a first epitaxial semiconductor shell 50. As used herein, a "semiconductor shell" refers to a semiconductor material portion that laterally encloses another structure within a contiguous periphery defined by inner surfaces of the semiconductor material portion. Each first epitaxial semiconductor shell 50 is in epitaxially alignment with the first semiconductor material on all surfaces of the pair of parallel lengthwise sidewalls, the pair of parallel widthwise sidewalls, and the planar top surface of the underlying first semiconductor fin 30. Each first epitaxial semiconductor shell 50 is formed by selective epitaxy of the second semiconductor material. The thickness of each first epitaxial semiconductor shell 50 can be in a range from 1% to 30% of the thickness of the first semiconductor fin 30 that the first epitaxial semiconductor shell 50 contacts, and can be, for example, in a range from 1 nm to 30 nm, although lesser and greater thicknesses can also be employed.

Because the second semiconductor material is lattice-mismatched with respect to the first semiconductor material, each portion of a first epitaxial semiconductor shell 50 has a biaxial strain within a plane that is parallel to a proximal interface with the first semiconductor fin 30. As used herein, a "proximal interface" refers to the interface that is the most proximate from the point of measurement or reference.

The exemplary semiconductor structure includes an insulator layer located in a substrate (10, 20). The insulator layer can be a buried insulator layer 20 derived from an SOI substrate, or can be a shallow trench isolation layer including a dielectric material and formed over a remaining portion of a bulk semiconductor substrate after formation of semiconductor fins (30, 40). Each first semiconductor fin 30 can include the first semiconductor material, and can be laterally bounded by a pair of parallel lengthwise sidewalls and a pair of parallel widthwise sidewalls, and located on the insulator layer. Each first epitaxial semiconductor shell 50 includes the second semiconductor material that is epitaxially aligned to the first semiconductor material, and contiguously contacts all of the pair of parallel lengthwise sidewalls and all of the pair of parallel widthwise sidewalls.

In one embodiment, each first epitaxial semiconductor shell 50 can have the same thickness on the pair of parallel lengthwise sidewalls and on the pair of parallel widthwise sidewalls. Each first semiconductor fin 30 can include a planar top surface having a periphery that coincides with top edges of the pair of parallel lengthwise sidewalls and the pair of parallel widthwise sidewalls. Each first epitaxial semiconductor shell 50 can contact the entirety of the planar top surface of an underlying first semiconductor fin 30.

The first dielectric mask layer 72 is subsequently removed selective to the first epitaxial semiconductor shells 50 and the second semiconductor fins 40, for example, by a wet etch. For example, if the first dielectric mask layer 72 includes silicon oxide, a wet etch employing hydrofluoric acid can be employed.

Referring to FIGS. 8A and 8B, a second dielectric mask layer 74 is formed on the top surfaces and the sidewalls of the semiconductor fins (30, 40) and the top surface of the buried insulator layer 20 (or a portion of a bulk semiconductor substrate underlying the semiconductor fins). The second dielectric mask layer 74 includes a dielectric material such as silicon oxide, silicon nitride, silicon oxynitride, dielectric metal oxide, or a combination thereof. The second dielectric mask layer 74 is formed by a conformal deposition method such as chemical vapor deposition (CVD) or atomic layer deposition (ALD). The thickness of the second dielectric mask layer 74 can be in a range from 1 nm to 30 nm, although lesser and greater thicknesses can also be employed.

A second patterned photoresist layer 77 covering the first semiconductor fins 30 and the first epitaxial semiconductor shells 50 in the first device region 100A can be formed, for example, by application of a blanket (unpatterned) photoresist layer over the entire area of the exemplary semiconductor structure, and subsequently removing portions of the applied photoresist layer from the second device region 100B, while the portion of the photoresist layer within the first device region 100A remains over the first semiconductor fins 30 and the first epitaxial semiconductor shells 50. Thus, the second patterned photoresist layer 77 can be present in the first device region 100A, and not present in the second device region 100B.

Referring to FIGS. 9A and 9B, the unmasked portion of the second dielectric mask layer 74 in the second device region 100B is removed by an etch, which can be an isotropic etch such as a wet etch. The second patterned photoresist layer 77 is subsequently removed, for example, by ashing.

Another selective epitaxy process is performed to deposit a single crystalline semiconductor material on the physically exposed surfaces of the second semiconductor fins 40. The single crystalline semiconductor material of the second semiconductor fins 40 is herein referred to as a third semiconductor material. The single crystalline semiconductor material deposited by the selective epitaxy process is herein referred to as a fourth semiconductor material. The fourth semiconductor material is a semiconductor material that is different from the third semiconductor material in composition, and can be single crystalline silicon, a single crystalline silicon germanium alloy, a single crystalline silicon carbon alloy, a single crystalline silicon germanium carbon alloy, or a single crystalline compound semiconductor material.

In one embodiment, the third semiconductor material can be a single crystalline silicon germanium alloy, and the fourth semiconductor material can be single crystalline silicon, a single crystalline silicon germanium alloy having a different atomic concentration of germanium than the third semiconductor material, a single crystalline silicon carbon alloy, or a single crystalline silicon germanium carbon alloy. In one embodiment, the fourth semiconductor material has a different band gap width than the second semiconductor material. In one embodiment, the first semiconductor material can be single crystalline silicon, the second semiconductor material can be a single crystalline silicon germanium alloy, the third semiconductor material can be another single crystalline silicon germanium alloy, and the fourth semiconductor material can be single crystalline silicon.

Because the fourth semiconductor material is different from the third semiconductor material, the selective epitaxy process is a selective heteroepitaxy process. During the selective epitaxy process, at least one semiconductor precursor gas and an etchant gas are flowed simultaneously or alternately into a processing chamber including the exemplary semiconductor structure. The fourth semiconductor material is deposited only on single crystalline surfaces such as the physically exposed surfaces of the second semiconductor fins 40, and is not deposited on amorphous surfaces such as the surfaces of the second dielectric mask layer 74 and the buried insulator layer 20.

Each contiguous portion of the fourth semiconductor material deposited directly on the surfaces of a second semiconductor fin 40 constitutes a contiguous semiconductor material layer that contacts all surfaces of a pair of parallel lengthwise sidewalls, a pair of parallel widthwise sidewalls, and a planar top surface of the second semiconductor fin 40, and is herein referred to as a second epitaxial semiconductor shell 60. Each second epitaxial semiconductor shell 60 is in epitaxially alignment with the second semiconductor material on all surfaces of the pair of parallel lengthwise sidewalls, the pair of parallel widthwise sidewalls, and the planar top surface of the underlying second semiconductor fin 40. Each second epitaxial semiconductor shell 60 is formed by selective epitaxy of the fourth semiconductor material. The thickness of each second epitaxial semiconductor shell 60 can be in a range from 1% to 30% of the thickness of the second semiconductor fin 40 that the second epitaxial semiconductor shell 60 contacts, and can be, for example, in a range from 1 nm to 30 nm, although lesser and greater thicknesses can also be employed.

Because the fourth semiconductor material is lattice-mismatched with respect to the third semiconductor material, each portion of a second epitaxial semiconductor shell 60 has a biaxial strain within a plane that is parallel to a proximal interface with the first semiconductor fin 30. In one embodiment, the first epitaxial semiconductor shells 50 can have a compressive biaxial strain within a plane that is parallel to a proximal interface with a most proximate first semiconductor fin 30, and the second epitaxial semiconductor shells 60 can have a tensile biaxial strain within a plane that is parallel to a proximal interface with a most proximate second semiconductor fin 40. In another embodiment, the first epitaxial semiconductor shells 50 can have a tensile biaxial strain within a plane that is parallel to a proximal interface with a most proximate first semiconductor fin 30 and the second epitaxial semiconductor shells 60 can have a compressive biaxial strain within a plane that is parallel to a proximal interface with a most proximate second semiconductor fin 40. In one embodiment, each epitaxial semiconductor shell (50 or 60) can be biaxially strained in directions parallel to a proximal interface with a most proximate semiconductor fin (30 or 40).

Each second semiconductor fin 40 can include the third semiconductor material, and can be laterally bounded by a pair of parallel lengthwise sidewalls and a pair of parallel widthwise sidewalls, and located on the insulator layer. Each second epitaxial semiconductor shell 60 includes the fourth semiconductor material that is epitaxially aligned to the third semiconductor material, and contiguously contacts all of the pair of parallel lengthwise sidewalls and all of the pair of parallel widthwise sidewalls.

In one embodiment, each second epitaxial semiconductor shell 60 can have the same thickness on the pair of parallel lengthwise sidewalls and on the pair of parallel widthwise sidewalls. Each second semiconductor fin 40 can include a planar top surface having a periphery that coincides with top edges of the pair of parallel lengthwise sidewalls and the pair of parallel widthwise sidewalls. Each second epitaxial semiconductor shell 60 can contact the entirety of the planar top surface of an underlying second semiconductor fin 40.

Figure 10A:
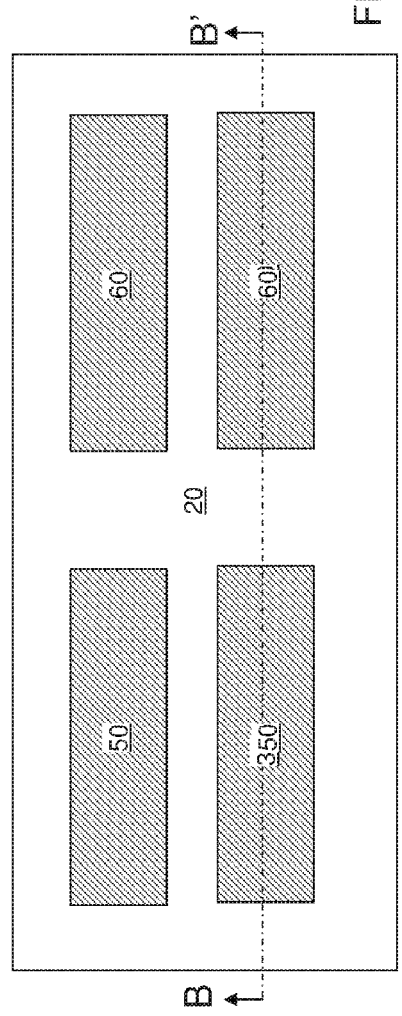
FIG. 10A is a top-down view of the exemplary semiconductor structure after removal of the second dielectric mask layer according to an embodiment of the present disclosure.
Figure 10B:
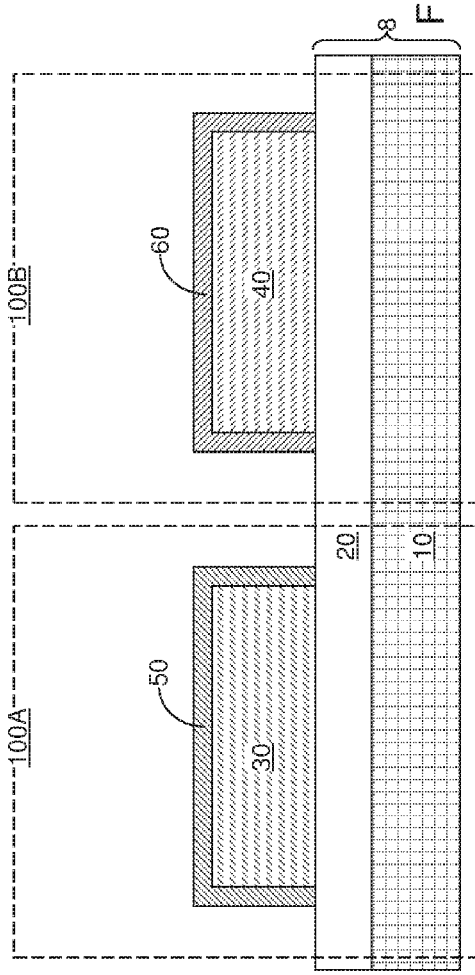
FIG. 10B is a vertical cross-sectional view of the exemplary semiconductor structure of FIG. 10A along the vertical plane B-B' of FIG. 10A.

Referring to FIGS. 10A and 10B, the second dielectric mask layer 74 is subsequently removed selective to the first epitaxial semiconductor shells 50 and the second epitaxial semiconductor shells 60, for example, by a wet etch. For example, if the second dielectric mask layer 74 includes silicon oxide, a wet etch employing hydrofluoric acid can be employed.

Referring to FIGS. 11A and 11B, a gate dielectric layer and a gate conductor layer are deposited and lithographically patterned to form gate structures. The gate structures include a first gate structure (80A, 82A) formed in the first device region 100A and a second gate structure (80N, 82B) formed in the second device region 100B. The first gate structure (80A, 82A) includes a first gate dielectric 80A, which is a remaining portion of the gate dielectric layer, and a first gate electrode 82A, which is a remaining portion of the gate conductor layer. The first gate structure (80A, 82A) straddles at least one integrated assembly of a first semiconductor fin 30 and a first epitaxial semiconductor shell 50 (See FIGS. 10A and 10B). The second gate structure (80B, 82B) includes a second gate dielectric 80B, which is a remaining portion of the gate dielectric layer, and a second gate electrode 82B, which is a remaining portion of the gate conductor layer. The second gate structure (80B, 82B) straddles at least one integrated assembly of a second semiconductor fin 40 and a second epitaxial semiconductor shell 60 (See FIGS. 10A and 10B). As used herein, an "integrated assembly" refers to a structure including at least two physically contacting structures.

Dielectric gate spacers (84A, 84B) can be formed on sidewalls of each of the gate structures (80A, 82A, 80B, 82B), for example, by deposition of a conformal dielectric material layer and an anisotropic etch. The dielectric gate spacers (84A, 84B) can include, for example, a first gate spacer 84A formed in the first device region 100A, and a second gate spacer 84B formed in the second device region 100B.

Electrical dopants of a conductivity type (which can be p-type or n-type) can be implanted into the device regions (100A, 100B) to form various source and drain regions before, and/or after, formation of the dielectric gate spacers (84A, 84B). A first source region (30S, 50S) and a first drain region (30D, 50D) can be formed in portions of the first semiconductor fins 30 and the first epitaxial semiconductor shell 50 that are not masked by the first gate structure(s) (80A, 82A). A second source region (40S, 60S) and a second drain region (60D, 60D) can be formed in portions of the second semiconductor fins 40 and the second epitaxial semiconductor shell 60 that are not masked by the second gate structure(s) (80B, 82B). Unimplanted portions of each integral assembly of a first semiconductor fin 30 and a first epitaxial semiconductor shell 50 constitutes a first body region (30B, 50B). Unimplanted portions of each integral assembly of a second semiconductor fin 40 and a second epitaxial semiconductor shell 60 constitutes a second body region (40B, 60B).

Each first source region (30S, 50S) includes a first fin source portion 30S that is a doped portion of a first semiconductor fin 30, and a first shell source portion 50S that is a doped portion of a first epitaxial semiconductor shell 50. Each first drain region (30D, 50D) includes a first fin drain portion 30D that is a doped portion of a first semiconductor fin 30, and a first shell drain portion 50D that is a doped portion of a first epitaxial semiconductor shell 50. Each first body region (30B, 50B) includes a first fin body portion 30B that is an unimplanted portion of a first semiconductor fin 30, and a first shell body portion 50B that is an unimplanted portion of a first epitaxial semiconductor shell 50.

Each second source region (40S, 60S) includes a second fin source portion 40S that is a doped portion of a second semiconductor fin 40, and a second shell source portion 60S that is a doped portion of a second epitaxial semiconductor shell 60. Each second drain region (40D, 60D) includes a second fin drain portion 40D that is a doped portion of a second semiconductor fin 40, and a second shell drain portion 60D that is a doped portion of a second epitaxial semiconductor shell 60. Each second body region (40B, 60B) includes a second fin body portion 40B that is an unimplanted portion of a second semiconductor fin 40, and a second shell body portion 60B that is an unimplanted portion of a second epitaxial semiconductor shell 60.

Referring to FIGS. 12A and 12B, a contact level dielectric layer 90 is deposited over the gate structures (80A, 82A, 80B, 82B) and the integral assemblies of the semiconductor fins and the epitaxial semiconductor shells. The contact level dielectric layer 90 includes a dielectric material such as silicon oxide, silicon nitride, silicon oxynitride, and/or porous or non-porous organosilicate glass. Optionally, the top surface of the contact level dielectric layer 90 can be planarized.

Various contact via structures can be formed through the contact level dielectric layer 90. The various contact via structures can include, for example, a first source contact via structure 92S that provides electrical contact to the first source regions (30S, 50S), a first drain contact via structure 92D that provides electrical contact to the first drain regions (30D, 50D), a first gate contact via structure 92G that provides electrical contact to the first gate electrode 82A, a second source contact via structure 94S that provides electrical contact to the second source regions (30S, 50S), a second drain contact via structure 94D that provides electrical contact to the second drain regions (30D, 50D), and a second gate contact via structure 94G that provides electrical contact to the second gate electrode 82B.

Optionally, metal semiconductor alloy regions (82S, 82D, 84S, 84D) can be formed on the physically exposed top surface of the various shell source portions (50S, 60S) and the various shell drain portions (50D, 60D), for example, by deposition of a metal layer and an anneal that forms a metal semiconductor alloy (such as a metal silicide). Unreacted remaining portions of the metal semiconductor alloy can be removed, for example, by a wet etch.

A first fin field effect transistor can be formed in the first device region 100A, and a second fin field effect transistor can be formed in the second device region 100B. In one embodiment, the first semiconductor material can be single crystalline silicon, and the second semiconductor material can be a single crystalline silicon germanium alloy. In this case, the first fin field effect transistor can provide advantages of devices having a silicon-germanium channel. For example, the silicon-germanium channel provided by the first shell body portion(s) 50B can provide a greater on-current than a channel having a same geometry and including silicon. In addition, because the silicon material in the underlying first fin body portion(s) 30B has a greater band gap than silicon germanium alloys, the off-current of the first fin field effect transistor can be reduced relative to devices having a body region consisting of a silicon germanium alloy.

In one embodiment, the third semiconductor material can be a single crystalline silicon germanium alloy or a single crystalline silicon carbon alloy, and the fourth semiconductor material can be single crystalline silicon. In this case, the second fin field effect transistor can provide advantages of devices having a silicon surface in the second source region(s) (40S, 60S) and the second drain region(s). For example, silicon without germanium or silicon can provide a lower contact resistance upon metallization than a silicon germanium alloy or a silicon carbon alloy.

Referring to FIG. 3, a planarization dielectric layer 50 is deposited over the gate structures (70A, 72A, 70B, 72B, 70C, 72C), the various gate spacers (80A, 80B, 80C), the various source regions (92A, 92B, 92C), and the various drain regions (93A, 93B, 93C). The planarization dielectric layer 50 includes a dielectric material, which can be a self-planarizing dielectric material such as a spin-on glass (SOG), or a non-planarizing dielectric material such as silicon oxide, silicon nitride, organosilicate glass, or combinations thereof. The planarization dielectric layer 50 is subsequently planarized, for example, by chemical mechanical planarization (CMP) such that top surfaces of the gate structures (70A, 72A, 70B, 72B, 70C, 72C) become physically exposed. In one embodiment, the planarized top surface of the planarization dielectric layer 50 can be coplanar with the top surfaces of the gate structures (70A, 72A, 70B, 72B, 70C, 72C). The planarization dielectric layer 50 laterally surrounds the first gate structure (70A, 72A), the second gate structure (70B, 72B), and the third gate structure (70C, 72C).

Referring to FIGS. 13A and 13B, a variation of the exemplary semiconductor structure can be derived from the exemplary semiconductor structure of FIGS. 11A and 11B by forming raised source regions and raised drain regions by selective epitaxy of additional semiconductor materials. For example, a first raised source region 52S and a first raised drain region 52D can be formed on the physically exposed surfaces of the first fin source portions 50S and the first fin drain portions 50D by selective epitaxy of a doped semiconductor material, or by selective epitaxy of an undoped semiconductor material and subsequent doping of the deposited semiconductor material by ion implantation or plasma doping. Likewise, a second raised source region 62S and a second raised drain region 62D can be formed on the physically exposed surfaces of the second fin source portions 60S and the second fin drain portions 60D by selective epitaxy of a doped semiconductor material, or by selective epitaxy of an undoped semiconductor material and subsequent doping of the deposited semiconductor material by ion implantation or plasma doping. Optionally, dielectric mask layers (not shown) may be employed to mask various regions in which deposition of a semiconductor material is not desired during each of the selective epitaxy processes.

Referring to FIGS. 14A and 14B, the processing steps of FIGS. 12A and 12B can be performed to form various contact via structures.

An epitaxial semiconductor shell of the present disclosure provides a surface semiconductor layer having different electrical and/or metallurgical properties than the underlying semiconductor fin. Advantageous surface properties of the epitaxial semiconductor shell can be employed in conjunction with advantageous bulk properties of the underlying semiconductor fin to modulate on-current, off-current, and/or contact resistance of metal semiconductor alloy regions formed on the source regions and/or the drain regions of a field effect transistor.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A semiconductor structure comprising:
   an insulator layer located on a substrate;
   a semiconductor fin comprising a first semiconductor material, laterally bounded by a pair of parallel lengthwise sidewalls and a pair of parallel widthwise sidewalls, and located on said insulator layer; and
   an epitaxial semiconductor shell comprising a second semiconductor material that is epitaxially aligned to said first semiconductor material, and contiguously contacting all of said pair of parallel lengthwise sidewalls and all of said pair of parallel widthwise sidewalls, wherein a bottommost surface of said epitaxial semiconductor shell is coplanar with a bottommost surface of said semiconductor fin.

2. The semiconductor structure of claim 1, wherein said epitaxial semiconductor shell has a same thickness on said pair of parallel lengthwise sidewalls and on said pair of parallel widthwise sidewalls.

3. The semiconductor structure of claim 1, wherein said semiconductor fin further comprises a planar top surface having a periphery that coincides with top edges of said pair of parallel lengthwise sidewalls and said pair of parallel widthwise sidewalls, and said epitaxial semiconductor shell contacts an entirety of said planar top surface.

4. The semiconductor structure of claim 1, wherein said epitaxial semiconductor shell comprises a shell channel portion, a shell source portion, and a shell drain portion, wherein said shell channel portion comprises a pair of vertical portions and a horizontal portion and laterally contacts each of said shell source portion and said shell drain portion.

5. The semiconductor structure of claim 1, further comprising a gate dielectric laterally contacting sidewalls and a top surface of said epitaxial semiconductor shell.

6. The semiconductor structure of claim 1, wherein said epitaxial semiconductor shell is biaxially strained in directions parallel to a proximal interface with said semiconductor fin.

7. The semiconductor structure of claim 1, wherein said first and second semiconductor materials are selected from single crystalline silicon, a single crystalline silicon-germanium alloy, a single crystalline silicon-carbon alloy, and a single crystalline silicon-germanium-carbon alloy.

8. A semiconductor structure comprising:
   an insulator layer located on a substrate;
   a semiconductor fin comprising a first semiconductor material, laterally bounded by a pair of parallel lengthwise sidewalls and a pair of parallel widthwise sidewalls, and located on said insulator layer;
   an epitaxial semiconductor shell comprising a second semiconductor material that is epitaxially aligned to said first semiconductor material, and contiguously contacting all of said pair of parallel lengthwise sidewalls and all of said pair of parallel widthwise sidewalls;
   another semiconductor fin comprising a third semiconductor material, laterally bounded by another pair of parallel lengthwise sidewalls and another pair of parallel widthwise sidewalls, and located on said insulator layer; and
   another epitaxial semiconductor shell comprising a fourth semiconductor material that is epitaxially aligned to said third semiconductor material, and contiguously contacting all of said another pair of parallel lengthwise sidewalls and all of said another pair of parallel widthwise sidewalls.

9. The semiconductor structure of claim 8, wherein one of said epitaxial semiconductor shell and said another epitaxial semiconductor shell has a biaxial compressive strain within a plane that is parallel to a proximal interface with said semiconductor fin, and another of said epitaxial semiconductor shell and said another epitaxial semiconductor shell has a biaxial tensile strain within a plane that is parallel to a proximal interface with said another semiconductor fin.

10. The semiconductor structure of claim 8, wherein said first semiconductor material is single crystalline silicon, said second semiconductor material is a single crystalline silicon-germanium alloy, said third semiconductor material is another single crystalline silicon-germanium alloy, and said fourth semiconductor material is single crystalline silicon.

11. The semiconductor structure of claim 1, wherein said insulator layer comprises a shallow trench isolation layer located around a lower portion of each semiconductor fin.

12. The semiconductor structure of claim 1, wherein said insulator layer is a buried insulator layer of a semiconductor-on-insulator substrate.

13. The semiconductor structure of claim 1, wherein said second semiconductor material is a semiconductor material that has a different composition than said first semiconductor material.

14. The semiconductor structure of claim 1, wherein said second semiconductor material is a semiconductor material that has a different band gap width as compared to said first semiconductor material.

15. The semiconductor structure of claim 1, wherein said bottommost surface of said epitaxial semiconductor shell is also coplanar with a topmost surface of said insulator layer.

16. The semiconductor structure of claim 1, wherein a portion of said insulator layer is located directly beneath said semiconductor fin.

17. The semiconductor structure of claim 1, wherein said substrate is a portion of a bulk semiconductor material.

18. The semiconductor structure of claim 1, wherein said substrate is a handle substrate.

19. A semiconductor structure comprising:
an insulator layer located on a substrate;
a semiconductor fin comprising a first semiconductor material, laterally bounded by a pair of parallel lengthwise sidewalls and a pair of parallel widthwise sidewalls, and located on said insulator layer; and
an epitaxial semiconductor shell comprising a second semiconductor material that is epitaxially aligned to said first semiconductor material, and contiguously contacting all of said pair of parallel lengthwise sidewalls and all of said pair of parallel widthwise sidewalls, wherein said epitaxial semiconductor shell comprises a shell channel portion, a shell source portion, and a shell drain portion, wherein said shell channel portion comprises a pair of vertical portions and a horizontal portion and laterally contacts each of said shell source portion and said shell drain portion.

* * * * *